US006762471B2

(12) United States Patent
Kim (10) Patent No.: US 6,762,471 B2
(45) Date of Patent: Jul. 13, 2004

(54) THIN FILM RESONATOR AND METHOD FOR MANUFACTURING THE SAME

(75) Inventor: Eon-Kyeong Kim, Seoul (KR)

(73) Assignee: Mems Solutions Inc., Seoul (KR)

( * ) Notice: Subject to any disclaimer, the term of this patent is extended or adjusted under 35 U.S.C. 154(b) by 0 days.

(21) Appl. No.: 10/169,500

(22) PCT Filed: Nov. 7, 2001

(86) PCT No.: PCT/KR01/01894
§ 371 (c)(1),
(2), (4) Date: Jul. 3, 2002

(87) PCT Pub. No.: WO02/39537
PCT Pub. Date: May 16, 2002

(65) Prior Publication Data
US 2003/0030118 A1 Feb. 13, 2003

(30) Foreign Application Priority Data
Nov. 13, 2000 (KR) .......................................... 2000-67032

(51) Int. Cl.[7] .............................................. H01L 27/14
(52) U.S. Cl. ....................... 257/414; 310/321; 310/324; 310/346
(58) Field of Search ................................ 310/321, 324, 310/346

(56) References Cited

U.S. PATENT DOCUMENTS

| | | | | | |
|---|---|---|---|---|---|
| 4,642,508 A | * | 2/1987 | Suzuki et al. | ................ | 310/321 |
| 5,696,423 A | * | 12/1997 | Dydyk et al. | ................ | 310/346 |
| 6,441,539 B1 | * | 8/2002 | Kitamura et al. | ........... | 310/346 |

* cited by examiner

Primary Examiner—David Nelms
Assistant Examiner—Mai-Huong Tran
(74) Attorney, Agent, or Firm—Rabin & Berdo, P.C.

(57) ABSTRACT

A thin film resonator having enhanced performance and a manufacturing method thereof are disclosed. The thin film resonator includes a supporting means, a first electrode, a dielectric layer and a second electrode. The supporting means has several posts and a supporting layer formed on the posts. The first electrode, the dielectric layer and the second electrode are successively formed on the supporting layer. The thin film resonator is exceptionally small and can be highly integrated, and the thickness of the dielectric layer of the resonator can be adjusted to achieve the integration of multiple bands including radio, intermediate and low frequencies. Also, the thin film resonator can minimize interference and has ideal dimensions because of its compact substrate, making the thin film resonator exceptionally small, yet comprising a three-dimensional, floating construction.

13 Claims, 12 Drawing Sheets

THIN FILM RESONATOR AND METHOD FOR MANUFACTURING THE SAME

TECHNICAL FIELD

The present invention relates to a thin film resonator and a method for manufacturing the same, and more particularly to an integrated thin film resonator with multiple bands to enhance performance and an easy method for manufacturing the same.

BACKGROUND ART

Mobile communications has been rapidly developed as the main instrument serving the information society. This instrument has been influenced by the developments of two technologies: signal processing using modulation or demodulation of transmitted data over limited frequency bands, and the technology of manufacturing radio frequency (RF) hardware parts.

In particular, filters are most important among the parts used for RF mobile communication devices. Filters are able to select the signal requested by the user from numerous signals on the public communication network, or filter a signal transferred by the user. Thus, excellent filters were previously developed for high quality mobile communication. Recently, higher performance filters have been developed to be thinner and more light-weight. These features ensure that mobile communication devices consume less power and more portable.

In general, a resonator or a frequency filter is the device that transmits the frequencies of a message in a predetermined band, and filters the frequencies on other bands being produced by various electronic devices such as wireless phones, personal communication service devices, cellular phones or devices for the international mobile telecommunications 2000 (IMT-2000) as a band pass filter.

Presently, the dielectric filter and the surface acoustic wave (SAW) filter are widely used as the RF filter for mobile communication devices. The dielectric filter has some advantages such as high permeability, low insertion loss, stability at high temperatures and good mechanical strength. However, the dielectric filter is too large to be applied in a monolithic microwave integrated circuit (MMIC). Though the mono-blocked or the multi-layered surface mounted device (SMD) resonators are now developed with smaller dimensions, SMD resonators do not sufficiently overcome their size problems.

SAW filters are relatively smaller than dielectric filters and have simpler signal processing and more simplified circuits. The SAW filter also can be manufactured using semiconductor technology, and gives high quality results since the SAW filter's side rejection in its pass-band is greater than that of the dielectric filter. However, the SAW filter has large insertion losses below 3 dB and its manufacturing costs are high because it is manufactured using single crystal piezoelectric substrate composed of lithium niobate ($LiNbO_3$) or lithium titanate ($LiTaO_3$). Also, the SAW filter is manufactured using an ultraviolet ray exposure apparatus so that the SAW filter may not be used for high frequency bands above 5 GHz because the line width of the inter-digital transducer (IDT) is above 0.5 μm.

Film bulk acoustic resonators (FBAR) have been developed for next generation mobile communication devices. The FBAR can be mass-produced at low cost using semiconductor technology and is ultra light weight and thin. In addition, the FBAR can be freely combined with RF active devices. In particular, the FBAR has good insertion loss of about 1 to 1.5 dB-smaller than or identical to that of the dielectric filter. The FBAR also has excellent side rejection higher than the of the SAW filter by about 10 to 20 dB, thereby providing high quality results.

At present, the active elements of mobile communications include the Hetero-junction Bipolar Transistor (HBT) or the Metal Semiconductor Filed Effect Transistor (MESFET), but these are gradually being simplified and minimized by monolithic microwave integrated circuit (MMIC) technology. However, passive components of RF technology such as the filter, the duplexer filter or the antenna are relatively large and complicated structures so that the single chip may not be achieved due to passive components.

The FBAR or the stacked thin film bulk wave acoustic resonators (SBAR) are manufactured by forming piezoelectric material such as zinc oxide (ZnO) or aluminum nitride (AlN) on a substrate composed of silicon or gallium-arsenic (Ga—As) using RF sputtering method, thereby achieving the desired resonance provided by the piezoelectric material.

The thin film resonator can be manufactured at low cost and yet provide high quality, making it is applicable for use in various devices with frequency bands of 900 MHz to 10 GHz. In addition, the thin film resonator can be much smaller than the dielectric filter and has the added benefit of an insertion loss smaller than that of the SAW filter. Hence, a thin film filter such as FBAR can be used in any MMIC dependent on high quality and good stability.

The method for manufacturing conventional FBAR or the SBAR is disclosed at U.S. Pat. No. 6,060,818 issued to Richard C. Ruby et al.

Figure 1:
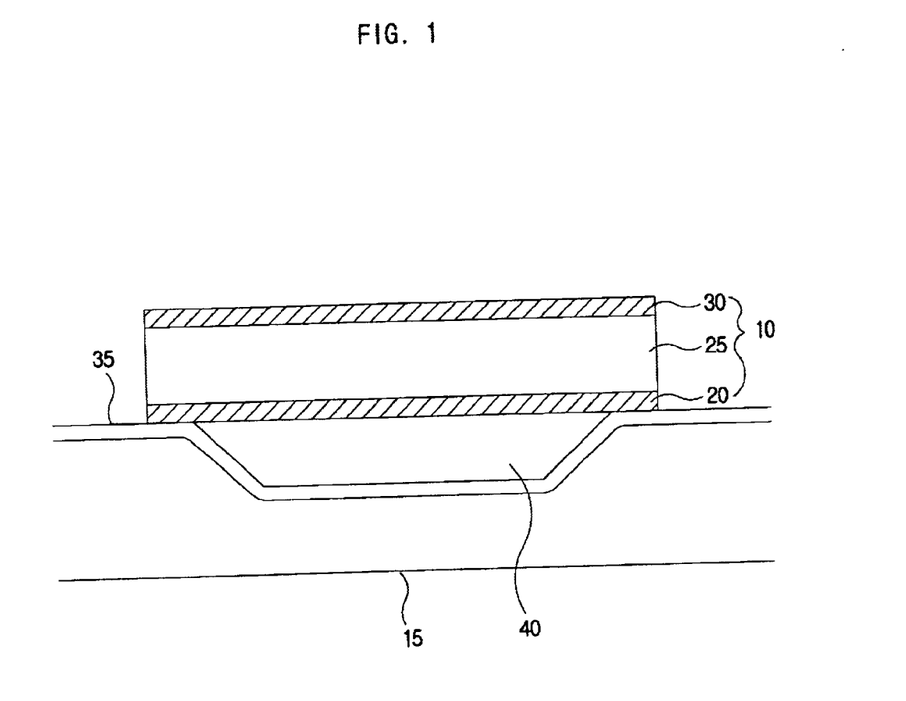
FIG. 1 is a cross-sectional view showing the conventional film bulk acoustic resonator.
Figure 2A:
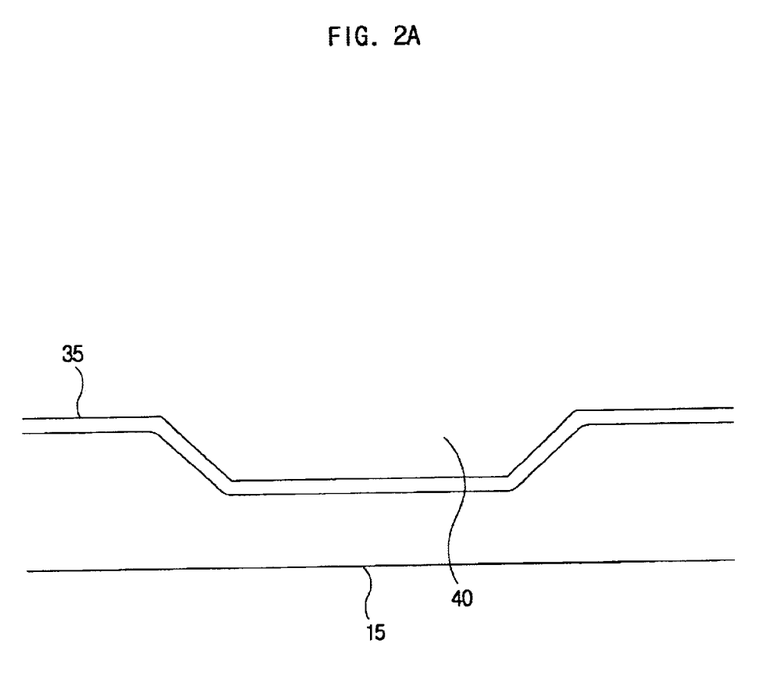
FIGS. 2A to 2C are cross-sectional views illustrating a method for manufacturing the conventional film bulk acoustic resonator in FIG. 1.
Figure 2B:
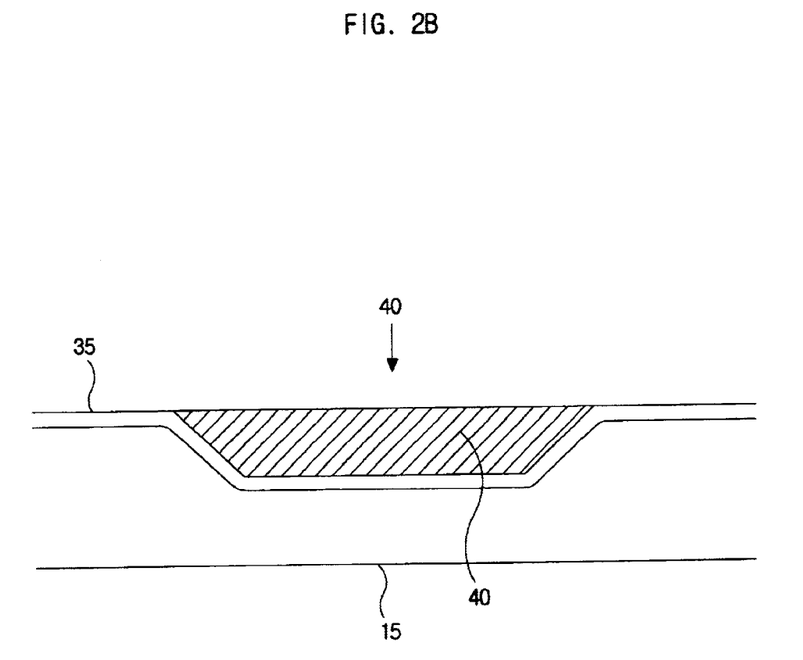
Figure 2C:
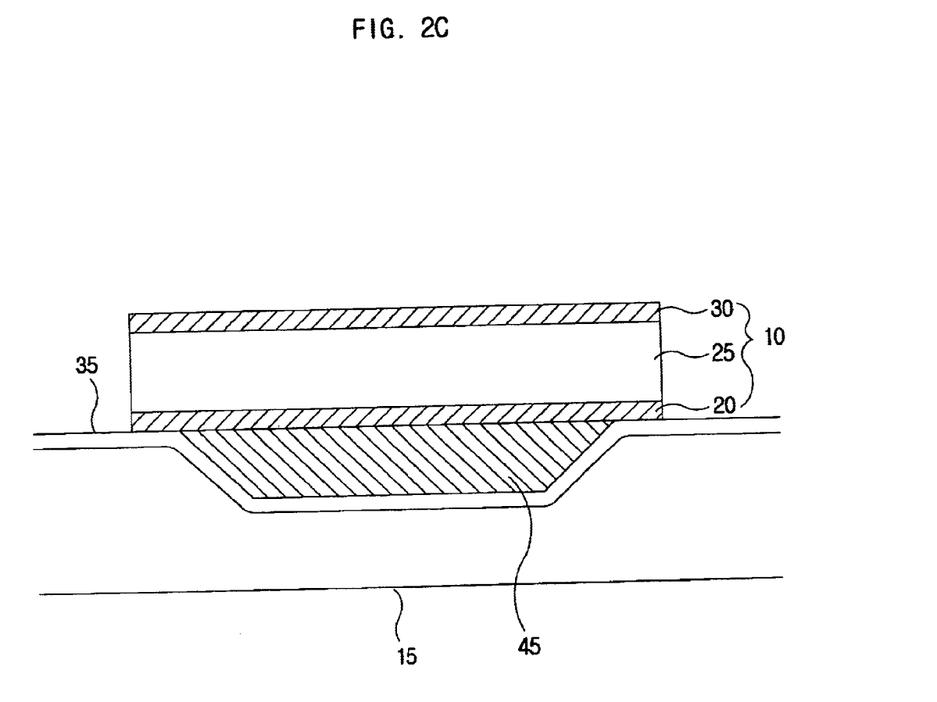

FIG. 1 is a cross-sectional view showing the FBAR and FIGS. 2A to 2C are cross-sectional views illustrating the method for manufacturing the FBAR in FIG. 1.

Referring to FIG. 1, the FBAR 10 is formed on a silicon substrate 15 and the FBAR 10 includes a bottom electrode 20, a piezoelectric layer 25 and a top electrode 30.

An oxide layer 35 is formed on the substrate 15 and a pit 40 is interposed between the substrate 15 and the FBAR 10.

Referring to FIG. 2A, the silicon substrate 15 is provided, and then the pit 40 having a predetermined depth is formed on the substrate 15 by partially etching the substrate 15. Subsequently, the oxide layer 35 is formed on the whole surface of the substrate 15 by the thermal oxidation method.

As shown in FIG. 2B, after a sacrificial layer 45 composed of phosphor silicate glass is coated on the oxide layer 35 to fill pit 40, the sacrificial layer is polished so that the sacrificial layer 45 remains only in the pit 40.

Referring to, FIG. 2C, after the bottom electrode 20 composed of molybdenum (Mo), the piezoelectric layer 25 composed of aluminum nitride (AlN), and the top electrode 30 composed of molybdenum are successively coated on the oxide layer 35 and on the sacrificial layer 45 filling the pit 40, the bottom electrode 20, the piezoelectric layer 25, and the top electrode 30 are patterned. Then, the sacrificial layer 45 is removed using an etching solution containing hydrofluoric acid (HF), thereby completing the FBAR 10 as shown in FIG. 1.

The conventional FBAR is, however, formed on the substrate where the cavity is positioned, giving the FBAR two-dimensional construction. Hence, the conventional FBAR provides poor quality performance with an increased insertion loss.

In addition, the interference of the substrate may not be blocked, causing the power loss of the FBAR to increase.

The size of the FBAR is limited also, since the FBAR is formed over the cavity in the substrate in order to receive the deformation of the piezoelectric layer.

Furthermore, the process for etching the silicon substrate demands much time, and the cost of manufacturing the FBAR increases because the conventional FBAR is formed on the silicon substrate where the cavity is positioned.

To overcome such problems, research institutes at Berkeley and Michigan Universities have disclosed a thin film bulk acoustic resonator (TFBAR) with a three-dimensional structure on a substrate using the micro-electromechanical system (MEMS) technology. However, the TFBAR may not be mass-produced and packaging the TFBAR may be difficult since its structure is complicated and the integration device including the TFBAR is difficult.

DISCLOSURE OF THE INVENTION

The present invention is intended to overcome the disadvantages described above. Therefore, it is an object of the present invention to provide a thin film resonator having an ultra minute size in order to achieve high integration with MEMS technology, and a method for manufacturing the thin film resonator.

It is another object of the present invention to provide a thin film resonator manufactured to be a multiple frequency band integrated thin film resonator by controlling the thickness of piezoelectric layer thereof, and a method for manufacturing the thin film resonator.

It is still another object of the present invention to provide a thin film resonator having a three-dimensional, floating construction to minimize power loss due to interference from the substrate, corresponding in size to the size of the substrate, and a method for manufacturing the thin film resonator.

It is still another object of the present invention to provide a thin film resonator manufactured at low cost, yet giving high quality results, and a method for manufacturing the thin film resonator.

It is still another object of the present invention to provide a thin film resonator having minute patterns and a three-dimensional form in order to obtain high quality results with low insertion loss, and a method for manufacturing the thin film resonator.

To accomplish the objects of the present invention according to one aspect of the present invention, there is provided a thin film resonator for filtering the frequency of a predetermined band comprising a supporting means having a plurality of posts formed on a substrate and a supporting layer formed on the posts, a first electrode formed on the supporting means, a dielectric layer formed on the first electrode, and a second electrode formed on the dielectric layer.

There are four posts formed on the substrate so as to support the supporting layer, and the supporting layer has a plurality of openings formed adjacent to each post, respectively.

Preferably, the supporting layer, the first electrode, the dielectric layer and the second electrode are each shaped like rectangular plates that, in combination, create a pyramid shape.

The first and the second electrodes are composed of metals selected from the group consisting of platinum, tantalum, platinum-tantalum, gold, molybdenum and tungsten. The dielectric layer is composed of materials selected from the group consisting of barium titanate, zinc oxide, aluminum nitride, lead zirconate titanate (PZT), lead lanthanum zirconate titanate (PLZT) and lead magnesium niobate (PMN).

The thin film resonator further comprises a connecting means for connecting the second electrode to a circuit formed on the substrate. The connecting means has a central portion and lateral potions bent from the central portion so that the connecting means contacts the circuit and the second electrode. As a result, a first air gap is interposed between the substrate and the supporting means and a second air gap is interposed between the second electrode and the connecting means. In this case, the connecting means is composed of metals selected from the group consisting of platinum, tantalum, platinum-tantalum, gold, molybdenum and tungsten.

To accomplish the objects of the present invention according to another aspect of the present invention, there is provided a method for manufacturing a thin film resonator for filtering frequencies on a predetermined band, which comprises the steps of forming a first sacrificial layer on a substrate, partially etching the first sacrificial layer to expose portions of the substrate, forming a plurality of posts on the exposed portions of the substrate, forming a first layer on the posts and the first sacrificial layer, forming a first metal layer on the first layer, forming a second layer on the first metal layer, forming a second metal layer on the second layer, forming a first electrode, a dielectric layer and a second electrode by patterning the second metal layer, the second layer and the first metal layer, forming a supporting layer having a plurality of openings by patterning the first layer, and removing the first sacrificial layer through the openings.

The first sacrificial layer is composed of poly silicon and formed by a low pressure chemical vapor deposition method and the first sacrificial layer is partially etched by a photolithography method, a reactive ion etching method or an argon laser etching method.

The posts are created through forming a BPSG layer on the first sacrificial layer and the substrate using a low pressure chemical vapor deposition method at temperatures under about 500° C., and polishing the BPSG layer to remove portions of the BPSG layer formed on the first sacrificial layer. At that time, the BPSG layer is polished by a chemical mechanical polishing method or an etch-back method.

The first layer is formed by a plasma enhanced chemical vapor deposition method or by using silicon oxide or phosphor oxide at temperatures from approximately 350 to 450° C.

The first and the second electrodes are formed by using metals selected from the group consisting of platinum, tantalum, platinum-tantalum, gold, molybdenum and tungsten using a sputtering method or a chemical vapor deposition method.

The second layer is formed from piezoelectric material or electrostrictive material using a sol-gel method, a sputtering method, a spin coating method or a chemical vapor deposition method. The second layer is composed of materials selected from the group consisting of barium titanate, zinc oxide, aluminum nitride, lead zirconate titanate (PZT), lead lanthanum zirconate titanate (PLZT) and lead magnesium niobate (PMN). In this case, the second layer is heat treated by a rapid thermal annealing method for the phase transition of the second layer.

The first sacrificial layer is removed with xenon fluoride or bromine fluoride.

Preferably, the method for manufacturing the thin film resonator comprises the steps of forming a second sacrificial layer on the substrate and the second electrode, partially etching the second sacrificial layer to expose a portion of the second electrode and a circuit formed on the substrate, forming a connecting means for connecting the second electrode to the circuit, and removing the second sacrificial layer.

The second sacrificial layer is composed of poly silicon or photo resist and formed by a low pressure chemical vapor deposition method or a spin coating method.

Preferably, the surface of the second sacrificial layer is planarized using a chemical mechanical polishing method or an etch-back method.

The connecting means is formed from metals selected from the group consisting of platinum, tantalum, platinum-tantalum, gold, molybdenum and tungsten using a sputtering method or a chemical vapor deposition method.

The second sacrificial layer is removed with xenon fluoride, bromine fluoride, etching solution containing hydrofluoric acid, or by using an argon laser etching method. At that time, the steps for removing the first and the second sacrificial layers are simultaneously performed.

In general, the resonator for filtering frequencies on a band operates according to the principle of resonance created due to a bulk acoustic wave generated from the piezoelectric layer that lies between two electrodes. The process for manufacturing such a resonator generally consists of forming the piezoelectric film composed of zinc oxide (ZnO) or aluminum nitride (AlN) on a substrate composed of silicon or gallium-arsenic (Ga—As), and forming a membrane and electrodes.

In the resonator manufacturing process, the piezoelectric film is fixed to the electrode and the piezoelectric film is adequately thin and flat, and of adequately high density. According to the conventional method, after the $P^+$ layer including a boron or silicon oxide layer, is formed on the silicon substrate by an ionic growth method, the bottom of the silicon substrate is anisotropically etched until the membrane forms a cavity formed in the substrate. Then, electrodes are formed on the membrane and the piezoelectric layer is interposed between the electrodes by using an RF magnetron sputtering method to form the thin film resonator. The piezoelectric materials used to form the piezoelectric layer requires a high specific resistance below 106 Ωcm with a standard deviation below 60, a large electromechanical coupling constant, and good cultivation. In addition, the piezoelectric material should have high breaking strength and quality reproduction results. However, the manufacturing process, including production of the abovementioned membrane products, experiences much failure because the membrane may be fractured when the thin film resonator is separated for packaging. Also, the thin film resonator may have low resonance characteristics because acoustic wave energy is lost due to the membrane. Recently, an air gap typed FBAR or a brag reflector typed FBAR has been used to reduce this loss of acoustic wave energy due to the membrane, and to simplify the resonator manufacturing process.

As for the air gap type of FBAR, after a sacrificial layer is formed on a silicon substrate using micro-machining technology, the air gap is formed at the point where the sacrificial layer is located. Hence, the manufacturing time and the generation of harmful gases can be reduced without using back-etching to form the membrane.

In the brag reflector typed FBAR, materials, each with different acoustic impedances, are alternatively formed on the silicon substrate to facilitate the brag reaction, thereby generating the resonance of the acoustic wave energies between electrodes. The brag reflector typed FBAR can be utilized as a ladder filter, a monolithic crystal filter, a stacked filter or a lattice filter can be a one chip type of thin film resonator. Such resonators may be manufactured quickly and have high mechanical strength, but their low electromechanical coupling constant is reduced by 30% when compared to the conventional FBAR.

According to the present invention, the thin film resonator is manufactured using MEMS technology without etching the substrate to have minute dimensions below hundreds of micrometers. Hence, the thin film resonator is exceptionally small and can be highly integrated onto the substrate. Also, the thickness of the dielectric layer of the thin film resonator can be adjusted to achieve the integration of multiple bands including radio frequency (RF), intermediate frequency (IF) and low frequency (LF) by controlling the thickness of the dielectric layer. Also, an inductor and a capacitor can be integrated.

In addition, yields can be increased and manufacturing costs can be greatly reduced since the thin film resonator can be manufactured without etching or machining the silicon substrate. Therefore, the manufacturing process of the present invention has excellent advantages during mass production, including simplicity and ease of packaging. Also, the thin film resonator of the present invention has a good quality factor of about 1000 to 10000 and a low insertion loss of under 2 dB, because the thin film resonator has minute patterns and a three-dimensional, floating construction, and is easily manufactured using the MEMS technology.

Furthermore, the thin film resonator of the present invention can minimize any interference due to its substrate, and has ideal dimensions because of its compact substrate, making the thin film resonator exceptionally small yet comprising three-dimensional, floating construction.

BRIEF DESCRIPTION OF THE DRAWINGS

The above objects and other advantages of the present invention will become more apparent through the detailed description of the preferred embodiments thereof with reference to the attached drawings in which:

FIGS. 5A to 5I are cross-sectional views illustrating a method for manufacturing the thin film resonator in FIG. 4.

BEST MODES FOR CARRYING OUT THE INVENTION

Hereinafter, preferred embodiments of the present invention will be described in more detail with reference to the accompanying drawings, but it is understood that the present invention should not be limited to the following embodiments.

Figure 3:
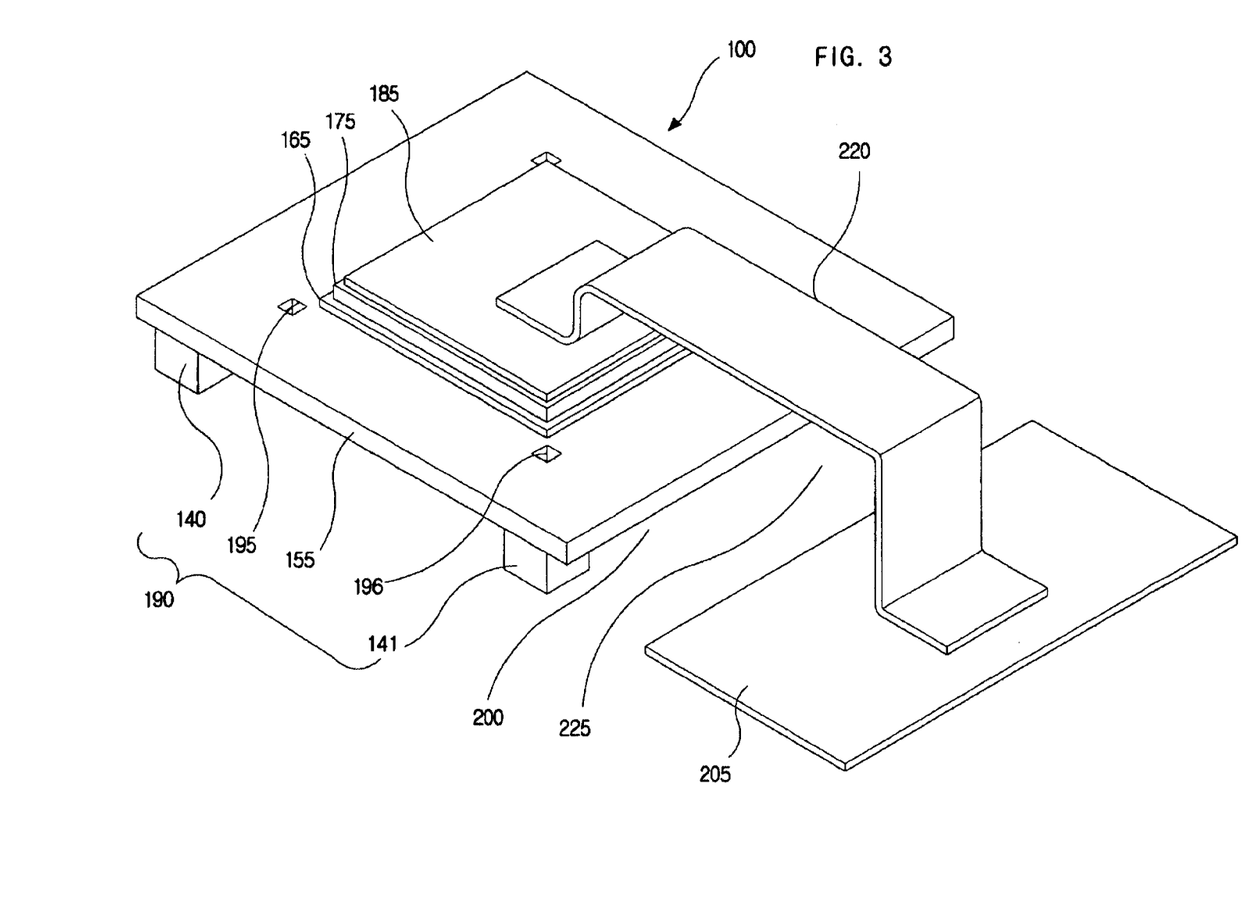
FIG. 3 is a perspective view showing a thin film resonator according to one preferred embodiment of the present invention.
Figure 4:
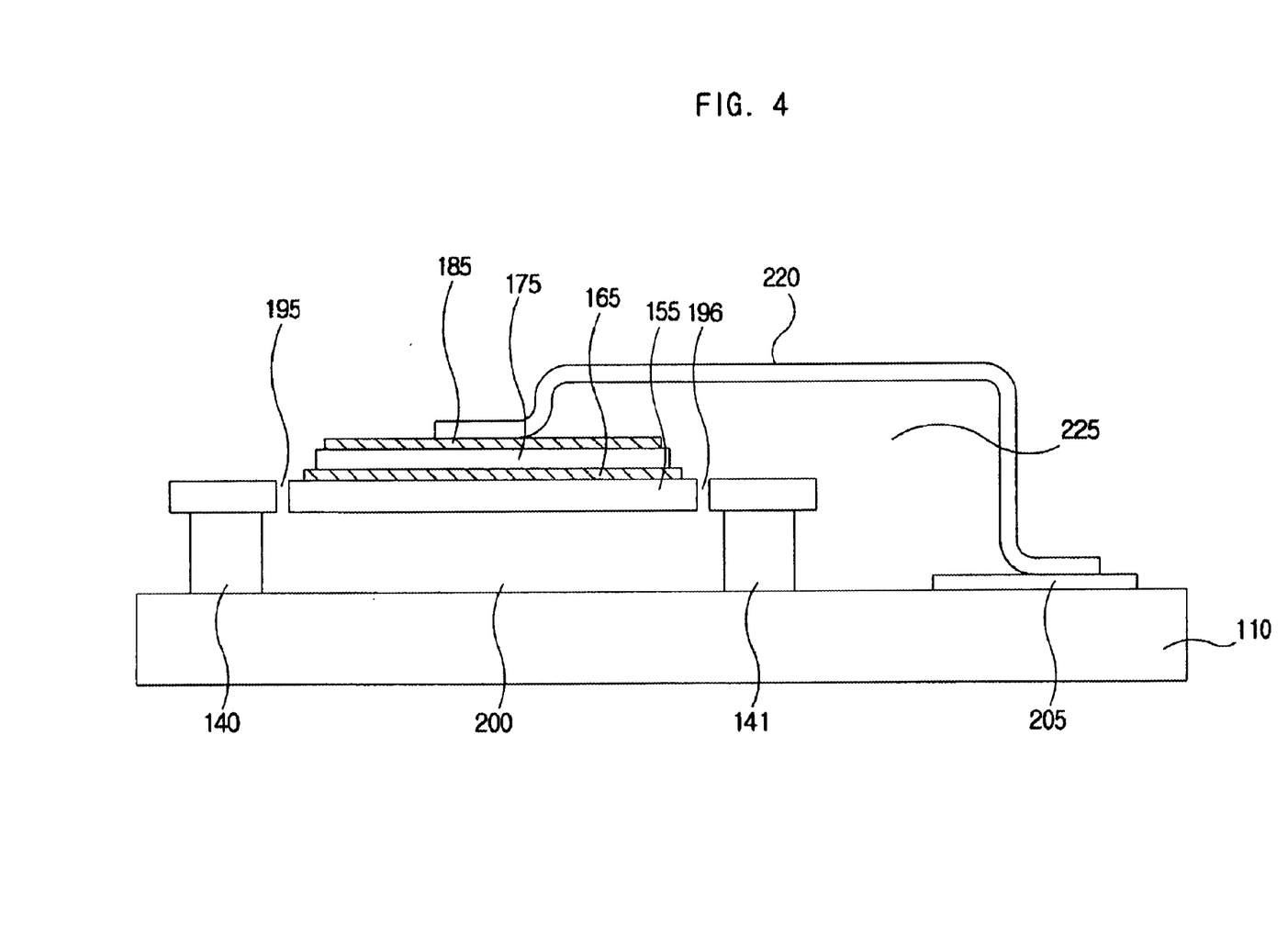
FIG. 4 is a cross-sectional view showing the thin film resonator in FIG. 3.

FIG. 3 is a perspective view showing a thin film resonator according to one preferred embodiment of the present invention and FIG. 4 is a cross-sectional view showing the thin film resonator in FIG. 3.

Referring to FIGS. 3 and 4, a thin film resonator 100 according to the present invention has a supporting member 190, a first electrode 165, a dielectric layer 175 and a second electrode 185. The thin film resonator 100 is formed on a substrate 110 and a first air gap 200 is interposed between the thin film resonator 100 and the substrate 110.

The supporting member 190 supports the thin film resonator 100 and includes a supporting layer 155 and a plurality of posts 140 and 141. The supporting layer 155 is composed of silicon nitride (AlN) and the posts 140 and 141 are respectively composed of boro-phosphor silicate glass (BPSG).

In the present embodiment, four posts are formed at predetermined portions of the substrate 110, respectively. The supporting layer 155 has the shape of a rectangular plate supported by the posts 140 and 141.

In addition, a plurality of openings 195 and 196 are formed through portions of the supporting layer 155 adjacent to the posts 140 and 141 respectively, so that the supporting layer 155 including those openings 195 and 196 performs a stress balancing role to prevent the thin layers of the thin film resonator 100 from bending while several thin layers are stacked to form the thin film resonator 100. The posts 140 and 141 support the supporting layer 155 and the structure thereon, and the first air gap 200 is interposed between the substrate 110 and the supporting layer 155. As a result, the thin film resonator 100 has a three-dimensional, floating construction, thereby minimizing power loss due to interference from the substrate 110.

The first electrode 165, the dielectric layer 175 and the second electrode 185 are successively formed on the supporting member 190. The first electrode 165, the dielectric layer 175 and the second electrode 185 respectively have rectangular plate shapes.

The first and the second electrode 165 and 185 are composed of metals having good electrical conductivity such as platinum (Pt), tantalum (Ta), platinum-tantalum (Pt—Ta), gold (Au), molybdenum (Mo) or tungsten (W). The dielectric layer 175 is composed of piezoelectric materials such as barium titanate ($BaTiO_3$), zinc oxide (ZnO), aluminum nitride (AlN), lead zirconate titanate (PZT; $Pb(Zr, Ti)O_3$), lead lanthanum zirconate titanate (PLZT; $(Pb, La)(Zr, Ti)O_3$). Also, the dielectric layer 175 is composed of electrostrictive materials, for example lead magnesium niobate (PMN; $Pb(Mg, Nb)O_3$). Preferably, the dielectric layer 175 is composed of PZT.

The first electrode 165 is smaller than the supporting layer 155, and the dielectric layer 175 is smaller than the first electrode 165. Also, the second electrode 185 is smaller than the dielectric layer 175, so that the thin film resonator 100 generally has the shape of a pyramid.

A connecting member 220 is formed from a circuit 205 to the second electrode 185 so as to connect the thin film resonator 100 with the circuit 205 formed on the substrate 110. The connecting member 220 has a shape of a bridge to connect the thin film resonator 100 with the second electrode 185, so that the thin film resonator 100 has a three-dimensional, floating construction. Both end portions of the connecting member 220 are bent to contact with the second electrode 185 and the circuit 205 respectively. The central portion of the connecting member 220 has the shape of a reverse 'U'. That is, the lateral portions of the connecting member 220 are primarily bent from the central portion of the connecting member 220 in a downward direction, and then the lateral portions of the connecting member 220 are secondarily bent in horizontal directions, respectively.

Hence, the end portions of the connecting member 220 are attached to the second electrode 185 and the circuit 205 respectively. The connecting member 220 is composed of metals having good electrical conductivity such as platinum, tantalum, platinum-tantalum, gold, molybdenum or tungsten.

Hereinafter, the method for manufacturing the thin film resonator according to one preferred embodiment of the present invention will be described in detail with reference to the accompanying drawings.

FIGS. 5A to 5I are cross-sectional views illustrating the method for manufacturing the thin film resonator in FIG. 4. In FIGS. 5A to 5I, the various elements have the same reference numerals as in FIGS. 3 and 4.

Figure 5A:
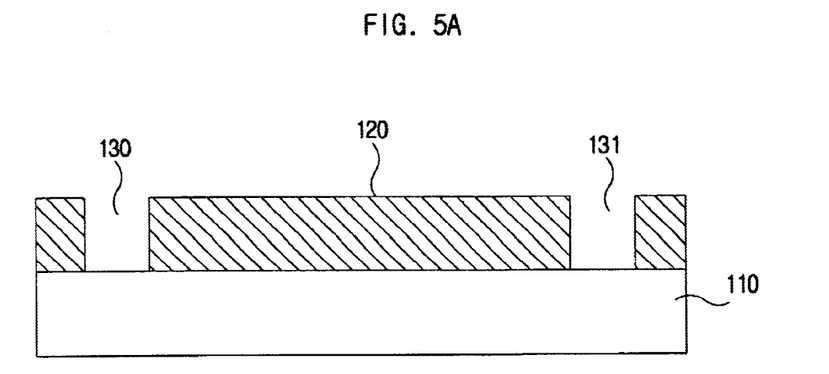

Referring to FIG. 5A, a first sacrificial layer 120 having the thickness of about 1 to 3μ, is formed on the substrate 100 by a low pressure chemical vapor deposition (LPCVD) method. The first sacrificial layer 120 is composed of poly silicon. In this case, the substrate 110 is composed of silicon or an insulating material such as glass or ceramic.

Subsequently, the first sacrificial layer 120 is partially etched using a photolithography method or a reactive ion etching method, thereby forming holes 130 and 131 that expose portions of the substrate 110. At that time, four holes are formed with reference to FIG. 3 though only two holes 130 and 131 are shown in FIG. 5A.

Figure 5B:
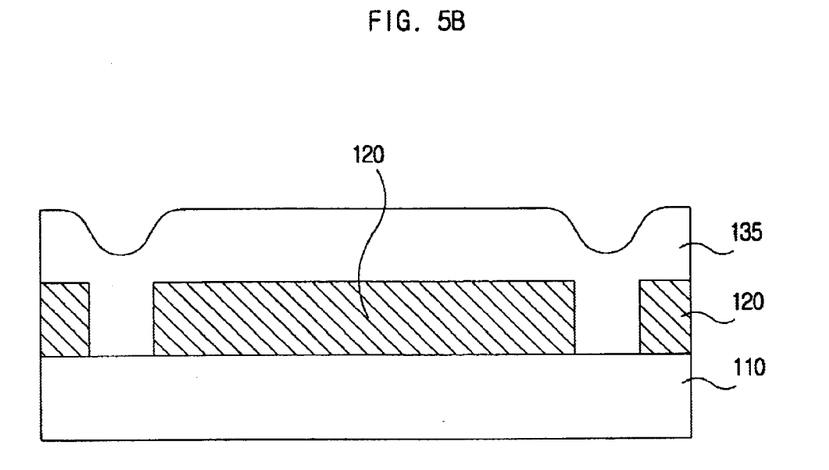

Referring to FIG. 5B, a BPSG film 135 is formed on the first sacrificial layer 120 and in the holes 130 and 131. The BPSG layer 135 is formed at temperatures below 500° C. using an LPCVD method. The BPSG layer 135 has a thickness of approximately 2.0 to 3.0 μm and the holes 130 and 131 that expose the substrate 110 are filled with the BPSG layer 135.

Figure 5C:
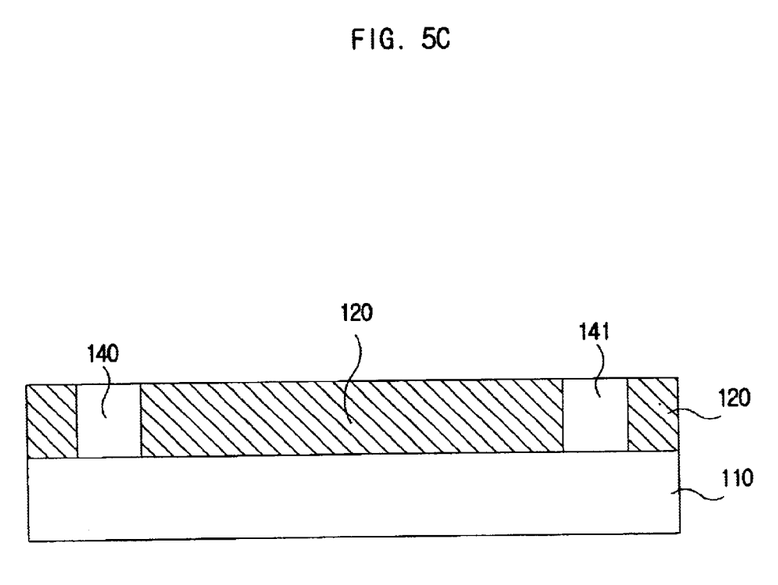

Referring to FIG. 5C, the BPSG layer 135 is polished using a chemical mechanical polishing method or an etch-back process to partially remove the portion of the BPSG layer 135 formed on the first sacrificial layer 120. Thus, portions of the BPSG layer 135 only remains in the holes 130 and 131 formed through the first sacrificial layer 120. The remaining portions of the BPSG layer 135 become the posts 140 and 141 for supporting the thin film resonator 100. The posts 140 and 141 and the successive supporting layer 155 together form a supporting member for supporting the thin film resonator 100. In this case, four posts composed of BPSG are formed as shown in FIG. 3 and the shapes of the posts are determined by the shapes of the holes formed through the first sacrificial layer 120. Hence, the posts assume the shapes of square pillars when the holes have rectangular cross sections, but assume the posts have the shapes of tubular columns when the holes have circular cross-sections. Also, when the holes have triangular cross sections, the posts assume the shape of triangular pillars.

Four posts are formed to enhance the stability of the thin film resonator 100, however, the number of the posts can be increased or reduced in accordance with the consumer's requirements for structural stability in the thin film resonator 100 according to another embodiment of the present invention.

In another embodiment of the present invention, the upper portion of the first sacrificial layer 120 can be partially polished while the BPSG layer 135 is being polished. Therefore, the surface of the first sacrificial layer 120 becomes more even, thereby enhancing the consistent flatness of the thin film resonator 100. According to still another embodiment of the present invention, the thin film resonator 100 can still have an enhanced flatness, even though the upper portion of the first sacrificial layer 120 is polished separately after the first sacrificial layer 120 is coated on the substrate 110.

Figure 5D:
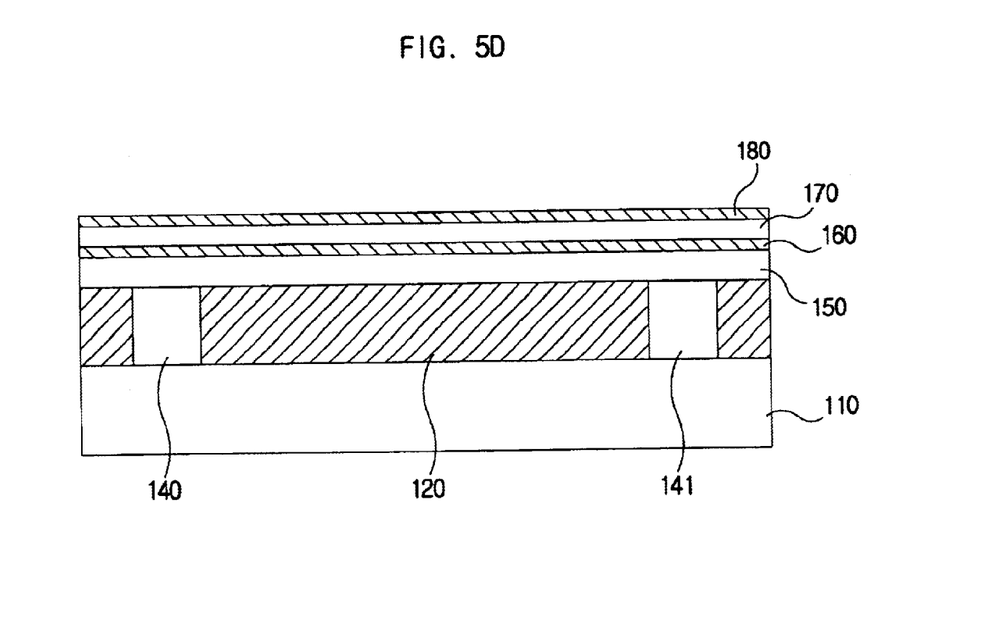

Referring to FIG. 5D, a first layer 150 composed of silicon nitride ($Si_xN_y$) is formed on the first sacrificial layer 120 and the posts 140 and 141. The first layer 150 has a thickness of approximately 0.1 to 1.0 μm resulting from treatment using a plasma enhanced chemical vapor deposition (PECVD) method. The first layer 150 will be patterned to form the supporting layer 155. According to another embodiment of the present invention, the first layer 150 can be composed of low temperature oxide (LTO) such as silicon oxide ($SiO_x$) or phosphor oxide ($P_2O_5$) at temperatures ranging from approximately 350 to 450° C.

Then, a first metal layer 160 is formed on the first layer 150. The first metal layer 160 is composed of metals having excellent electrical conductivity and good adhesive strength such as platinum, tantalum, platinum-tantalum, gold, molybdenum or tungsten. The first metal layer 160 is formed using a sputtering method or a CVD method to have a thickness of about 0.1 to 1.0 μm. The first metal layer 160 will be patterned to form the first electrode 165.

A second layer 170 is formed on the first metal layer 160. The second layer 170 is composed of dielectric components such as piezoelectric material or electrostrictive material. The second layer 170 is formed by a sol-gel method, a spin coating method, a sputtering method or a CVD method to achieve a thickness of about 0.1 to 1.0 μm. The second layer 170 will be patterned to form the dielectric layer 175. The second layer 170 is formed using barium titanate, zinc oxide, aluminum nitride, lead zirconate titanate (PZT), lead lanthanum zirconate titanate (PLZT) or lead magnesium niobate (PMN). Preferably, the second layer 170 is formed by spin coating the PZT, and is manufactured by a sol-gel method to have a thickness of about 0.4 μm.

According to another embodiment of the present invention, the second layer 170 is heat-treated using a rapid thermal annealing (RTA) method to drive the phase transition of the piezoelectric material or the electrostrictive material of the second layer 170 after the second layer 170 is formed. Hence, the dielectric layer 175 can easily respond to any electric field generated between the first electrode 165 and the second electrode 185. Also, the mechanical responsiveness of the dielectric layer 175 can easily transfer energy to the first and the second electrodes 165 and 185. That is, the dielectric layer 175 converts electrical energy to sound wave energy when an electric field is generated between the first electrode 165 and the second electrode 185, and voltage is applied to the thin film resonator 100. The sound wave proceeds in the same direction as the electric field, and reflects from the interface between the second electrode 185 and the air, thereby operating the thin film resonator 100 as a filter.

Then, a second metal layer 180 is formed on the second layer 170. The second metal layer 180 is composed of a metal identical to the first metal layer 160 which could be platinum, tantalum, platinum-tantalum, gold, molybdenum or tungsten. The second metal layer 180 is formed by means of a sputtering method or a CVD method so that the second metal layer 180 has a thickness of about 0.1 to 1.0 μm. The second metal layer 180 will be patterned to form the second electrode 185.

Figure 5E:
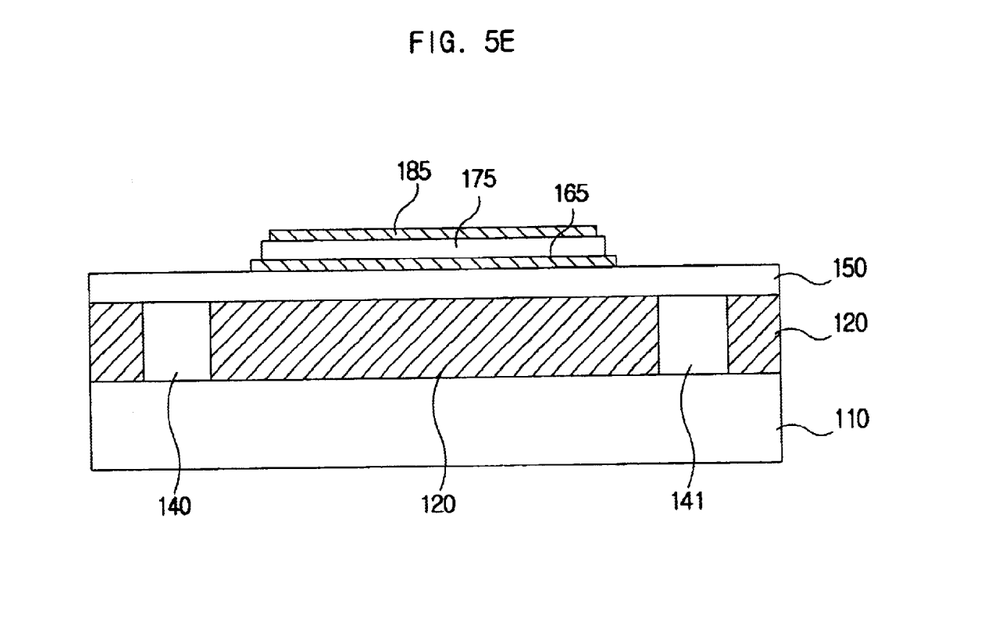

Referring to FIG. 5E, after a photo resist (not shown) is coated on the second metal layer 180 and the photo resist is patterned to form a photo resist pattern, the second metal layer 180 is patterned to have the shape of a rectangular plate by using the photo resist pattern as an etching mask, thereby forming the second electrode 185 (see FIG. 3).

Then, the second layer 179 and the first metal layer 160 are successively patterned using the above-described method after the proto resist pattern is removed. Thus, the dielectric layer 175 and the first electrode 165 respectively have the shapes of rectangular plates, and are formed as shown in FIG. 3. In this case, the dielectric layer 175 is larger than the second electrode 185 and the first electrode 165 is larger than the dielectric layer 175. Therefore, the first electrode 165, the dielectric layer 175 and the second electrode 185 combine to form the shape of a pyramid.

Figure 5F:
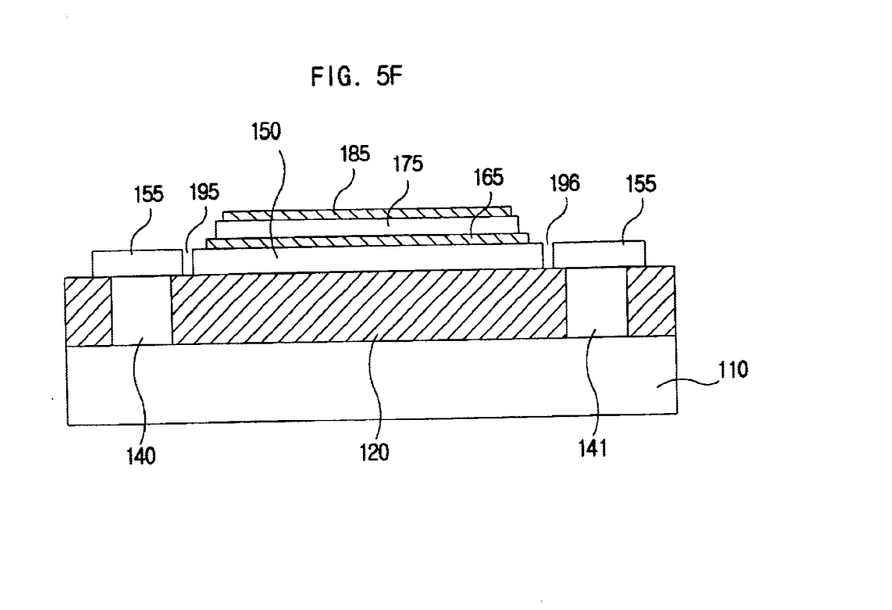

Referring to FIG. 5F, the first layer 150 is patterned using a reactive ion etching method or a photolithography method so as to form the supporting layer 155 including the openings 195 and 196 that are adjacent to the posts 140 and 141 respectively. At that time, the openings 195 and 196 are preferably formed during the patterning of the first layer 150 that forms the supporting layer 155. However, the openings 195 and 196 are formed after the supporting layer 155.

The openings 195 and 196 perform as passages for injecting the etching solution or ions used to etch the first sacrificial layer 120, thereby easily removing the first sacrificial layer 120. This minimizes interference from the thin film resonator 100 due to the substrate 110, because four openings are formed as shown in FIG. 3.

Figure 5G:
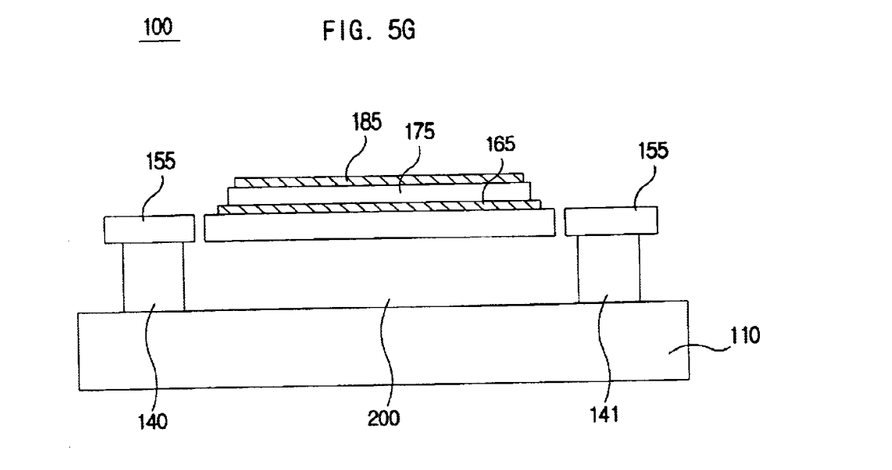

Referring to FIG. 5G, the first sacrificial layer 120 is removed by using an etching solution that includes hydrofluoric (HF) acid through the openings 195 and 196, and then the thin film resonator 100 is formed after a washing and a drying processes are performed. The first sacrificial layer 120 can also be removed by using xenon fluoride ($XeF_2$) or bromine fluoride ($BrF_2$). Furthermore, the first sacrificial layer 120 can be removed by means of an argon laser etching method. The first air gap 200 is formed at the point of the first sacrificial layer 120 as the first sacrificial layer 120 is removed. That is, the thin film resonator 100 is formed on the substrate 110 and the first air gap 200 is interposed between the substrate 110 and the thin film resonator 100.

Figure 5H:
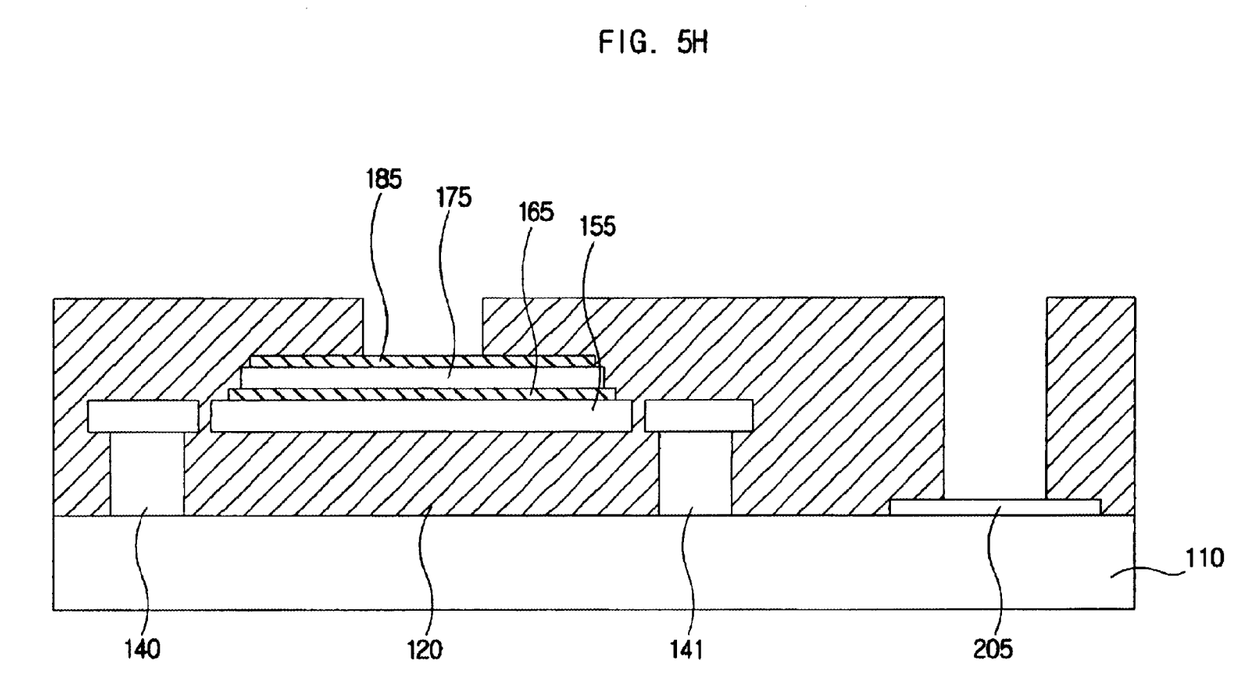

Referring to FIG. 5H, a second sacrificial layer 210 is coated on the whole surface of the substrate 110 where the thin film resonator 100 is formed as above described after the circuit 205 is created on the substrate 110. The second sacrificial layer 210 is composed of poly silicon using an LPCVD method identical to that used to form the first sacrificial layer 120. In addition, the second sacrificial layer 210 can be composed of photo resist added using a spin coating method. In this case, the surface of the second sacrificial layer 210 can be polished by a chemical mechanical polishing method in order to enhance the flatness of the second sacrificial layer 210. Also, the surface of the second sacrificial layer 210 can be planed using an etch-back process.

Subsequently, the second sacrificial layer 210 is partially etched using a photolithography process or an argon laser etching process to partially expose the second electrode 185 of the thin film resonator 100 and the circuit 205 formed on the substrate 110.

Referring to FIG. 5I, a third metal layer is formed on the exposed portion of the second electrode 185, the exposed portion of the circuit 205 and the second sacrificial layer 210. The third metal layer is composed of a metal identical to that of the first metal layer 160 such as platinum, tantalum, platinum-tantalum, gold, molybdenum or tungsten. The third metal layer is deposited by a sputtering method or a CVD method so that the third metal layer has a thickness of about 0.1 to 1.0 μm.

Then, the third metal layer is patterned to form the connecting member 220 that electrically connects the thin film resonator 100 to the circuit 205 on the substrate 110.

Subsequently, the second sacrificial layer 210 is removed by an etching solution containing hydrofluoric acid, xenon fluoride, bromine fluoride or by suing an argon laser etching method. Then, the thin film resonator 100, having the connecting member 220 is completed after a washing and a drying process are performed. When the second sacrificial layer 210 is removed, a second air gap 225 is formed at the point where the second sacrificial layer 210 was positioned, so that the second air gap 225 is interposed between the substrate 110, the thin film resonator 100 and the connecting member 220.

In one preferred embodiment of the present invention, after the first sacrificial layer 120 is removed, the connecting member 220 is formed on the second sacrificial layer 210, and then the second sacrificial layer 210 is removed. However, according to another embodiment of the present invention, the first and the second sacrificial layers 120 and 210 are simultaneously removed after the connecting member 220 is formed on the second sacrificial layer 210 without removing the first sacrificial layer 120. By using this production method, the manufacturing time and costs can be reduced.

While this invention has been described and shown as having multiple designs, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

INDUSTRIAL APPLICABILITY

As it is described above, the thin film resonator of the present invention is manufactured using the MEMS technology without etching the substrate to have minute dimensions under hundreds of micro meters. Hence, the thin film resonator is exceptionally small and can be highly integrated onto the substrate.

Also, the thickness of the dielectric layer of the thin film resonator can be adjusted to achieve the integration of the multiple bands including radio frequency (RF), intermediate frequency (IF) and low frequency (LF) by controlling the thickness of the dielectric layer. Also, an inductor and a capacitor can be integrated.

In addition, the yield can be increased and the manufacturing costs greatly reduced since the thin film resonator can be manufactured without etching or machining the silicon substrate. Therefore, the manufacturing process of the present invention has excellent advantages during mass production, including simplicity and ease of packaging.

Also, the thin film resonator of the present invention has a good quality factor of about 1000 to 10000 and a low insertion loss of under 2 dB because the thin film resonator has minute patterns and a three-dimensional, floating construction that is easily manufactured by the MEMS technology.

Furthermore, the thin film resonator of the present invention can minimize interference from the substrate and has ideal dimensions because of its compact substrate, making the thin film resonator exceptionally small. Yet having a three-dimensional, floating construction.

What is claimed is:

1. A thin film resonator for filtering frequencies of a predetermined band, which comprises:

a supporting means having a plurality of posts formed on a substrate and a supporting layer formed on said posts, wherein said supporting layer is composed of a non-piezoelectric material, wherein said posts are formed on said substrate so that said supporting layer is supported at positions proximate to its periphery by said posts, and wherein a plurality of openings are formed through said supporting layer;

a first electrode formed on said supporting means;

a dielectric layer composed of a piezoelectric material formed on said first electrode;

a second electrode formed on said dielectric layer; and a connecting means for connecting said second electrode to a circuit formed on said substrate, wherein a first air gap is interposed between said substrate and said supporting means and a second air gap is interposed between said second electrode and said connecting means.

2. The thin film resonator as recited in claim 1, wherein four posts are formed on said substrate so that said supporting layer is supported by said four posts.

3. The thin film resonator as recited in claim 1, wherein said posts are respectively composed of boro-phosphor silicate glass and said supporting layer is composed of silicon nitride.

4. The thin film resonator as recited in claim 1, wherein said supporting layer, said first electrode, said dielectric layer and said second electrode are shaped like rectangular plates.

5. The thin film resonator as recited in claim 4, wherein said first electrode is smaller than said supporting layer, said dielectric layer is smaller than said first electrode, and said second electrode is smaller than said dielectric layer.

6. The thin film resonator as recited in claim 4, wherein said supporting layer, said first electrode, said dielectric layer and said second electrode combine to form a pyramid shape.

7. The thin film resonator as recited in claim 1, wherein said first electrode is composed of metals selected from the group consisting of platinum, tantalum, platinum-tantalum, gold, molybdenum and tungsten.

8. The thin film resonator as recited in claim 1, wherein said second electrode is composed of metals selected from the group consisting of platinum, tantalum, platinum-tantalum, gold, molybdenum and tungsten.

9. The thin film resonator as recited in claim 1, wherein said first and said second electrodes are composed of the same metals having electrical conductivity and adhesion strength.

10. The thin film resonator as recited in claim 1, wherein said dielectric layer is composed of materials selected from the group consisting of barium titanate ($BaTiO_3$), zinc oxide (ZnO), aluminum nitride (AlN), lead zirconate titanate (Pb(Zr, Ti)$O_3$), lead lanthanum zirconate titanate ((Pb, La)(Zr, Ti) $O_3$) and lead magnesium niobate (Pb(Mg, Nb)$O_3$).

11. The thin film resonator as recited in claim 1, wherein said connecting means has a central portion and lateral potions bent from the central portion so that said connecting means contacts with said circuit and said second electrode.

12. The thin film resonator as recited in claim 1, wherein said connecting means is composed of metals selected from the group consisting of platinum, tantalum, platinum-tantalum, gold, molybdenum and tungsten.

13. A thin film resonator for filtering frequencies of a predetermined band, which comprises:

a supporting means having four posts formed on a substrate and a supporting layer formed on said posts, wherein said posts are respectively composed of borophosphor silicate glass and said supporting layer is composed of silicon nitride, and wherein said posts are formed on said substrate so that said supporting layer is supported by said posts and a plurality of openings are formed through said supporting layer;

a first electrode formed on said supporting means;

a dielectric layer formed on said first electrode;

a second electrode formed on said dielectric layer; and a connecting means for connecting said second electrode to a circuit formed on said substrate, wherein a first air gap is interposed between said substrate and said supporting means and a second air gap is interposed between said second electrode and said connecting means.

* * * * *